(12) United States Patent
Balakrishnan et al.

(10) Patent No.: US 9,786,758 B1
(45) Date of Patent: Oct. 10, 2017

(54) VERTICAL SCHOTTKY BARRIER FET

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/180,251

(22) Filed: Jun. 13, 2016

(51) Int. Cl.
*H01L 29/66* (2006.01)
*H01L 29/47* (2006.01)
*H01L 29/423* (2006.01)
*H01L 29/786* (2006.01)

(52) U.S. Cl.
CPC ........ *H01L 29/47* (2013.01); *H01L 29/42392* (2013.01); *H01L 29/66545* (2013.01); *H01L 29/66666* (2013.01); *H01L 29/78618* (2013.01); *H01L 29/78642* (2013.01); *H01L 29/78696* (2013.01)

(58) Field of Classification Search
CPC ........ H01L 21/30621; H01L 21/31055; H01L 21/31116; H01L 21/31138; H01L 21/31144; H01L 21/67069; H01L 21/32135; H01L 21/30608; H01L 21/31056; H01L 21/76808; H01L 21/7681; H01L 21/76811; H01L 21/47573
USPC ............... 257/267, 281, 280, 284, 449, 453, 257/471–486; 438/694, 699, 700, 738, 438/739, 712
See application file for complete search history.

(56) References Cited

U.S. PATENT DOCUMENTS

| | | | |
|---|---|---|---|
| 9,640,667 B1 * | 5/2017 | Balakrishnan | .... H01L 29/42392 |
| 2015/0118836 A1 * | 4/2015 | Lin | ................... H01L 29/66545 |
| | | | 438/586 |
| 2015/0214331 A1 * | 7/2015 | Jang | .................. H01L 29/66545 |
| | | | 438/164 |

* cited by examiner

*Primary Examiner* — Sonya D McCall Shepard
(74) *Attorney, Agent, or Firm* — Tutunjian & Bitetto, P.C.; Louis J. Percello

(57) ABSTRACT

A method for fabricating a vertical Schottky barrier transistor includes forming fin trenches through a dielectric layer and a dummy gate stack on a substrate to expose an underlying semiconductor material. The dummy gate stack includes a bottom spacer, a dummy gate layer and a top spacer layer. Fins are epitaxially grown in the fin trenches from the underlying semiconductor material. The dummy gate layer is removed and forms a gate structure about the fins including a gate dielectric and a gate conductor. An interlevel dielectric (ILD) layer is deposited. A top of the fins is exposed to form a channel contact opening. A contact trench is formed through the ILD layer and into the underlying semiconductor material. A cavity is formed in the underlying semiconductor material below the bottom spacer layer. The cavity, the contact trench and the channel contact opening are filled with a conductive fill.

14 Claims, 13 Drawing Sheets

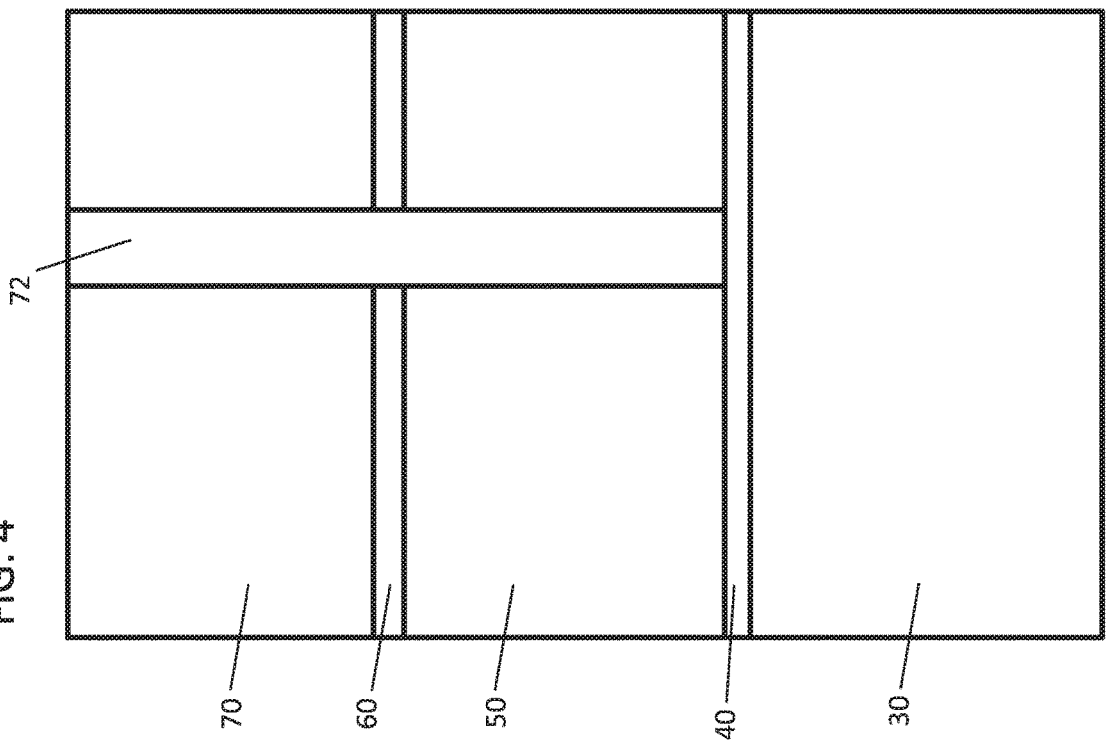
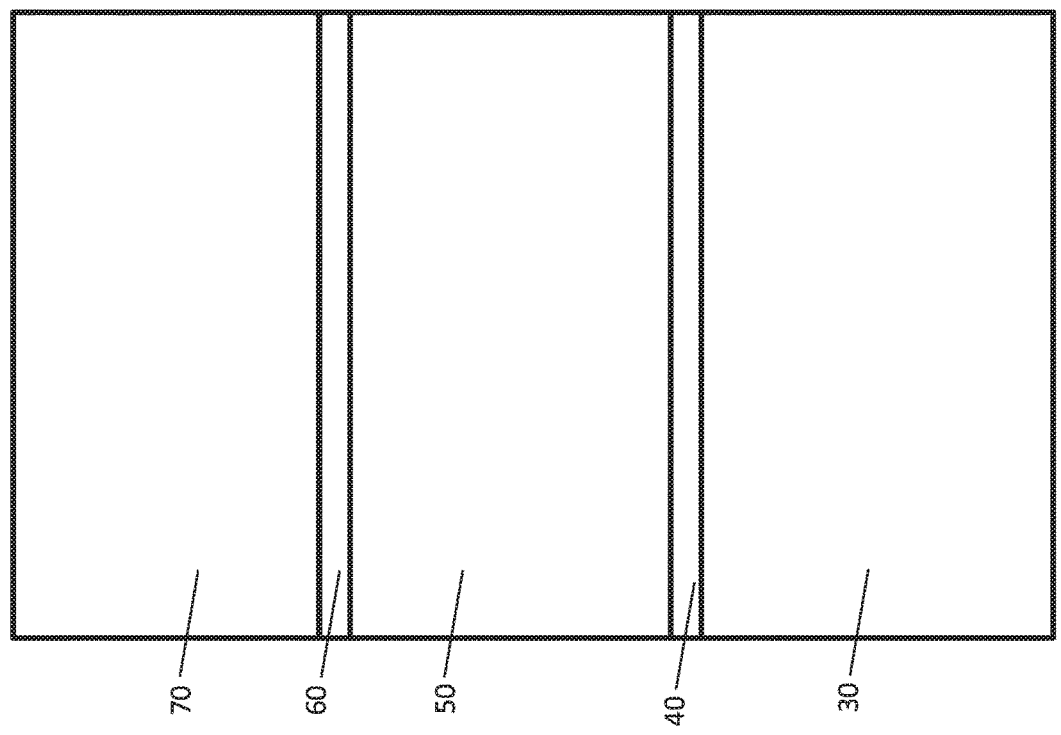

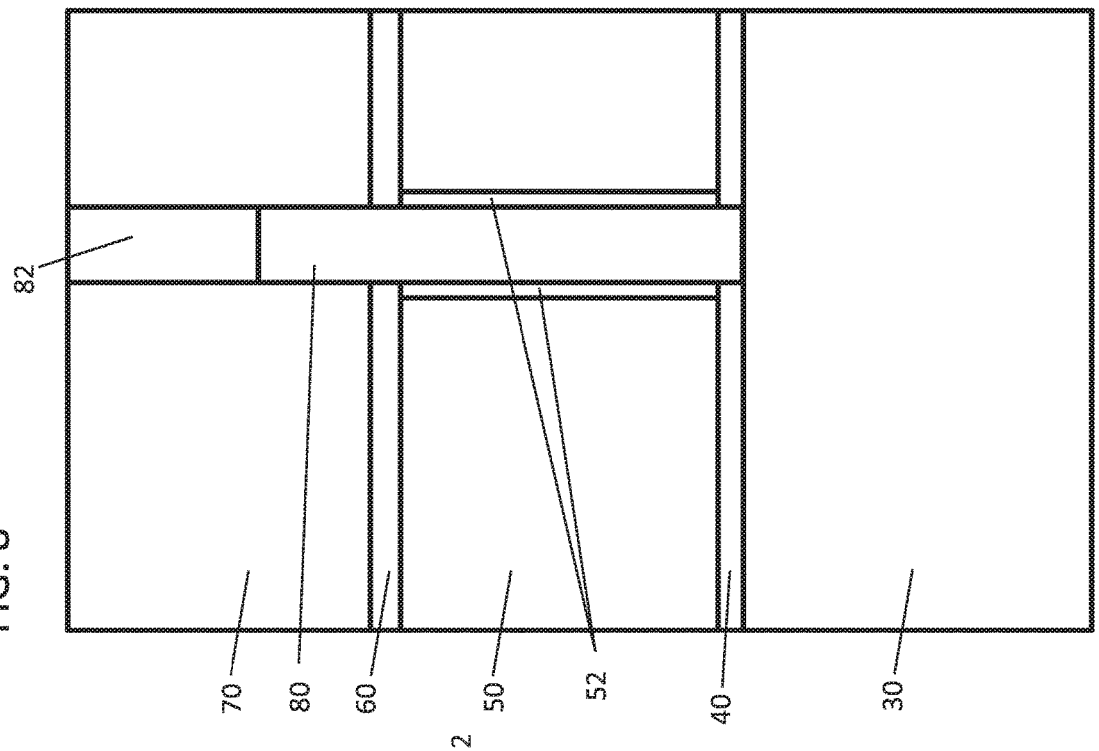
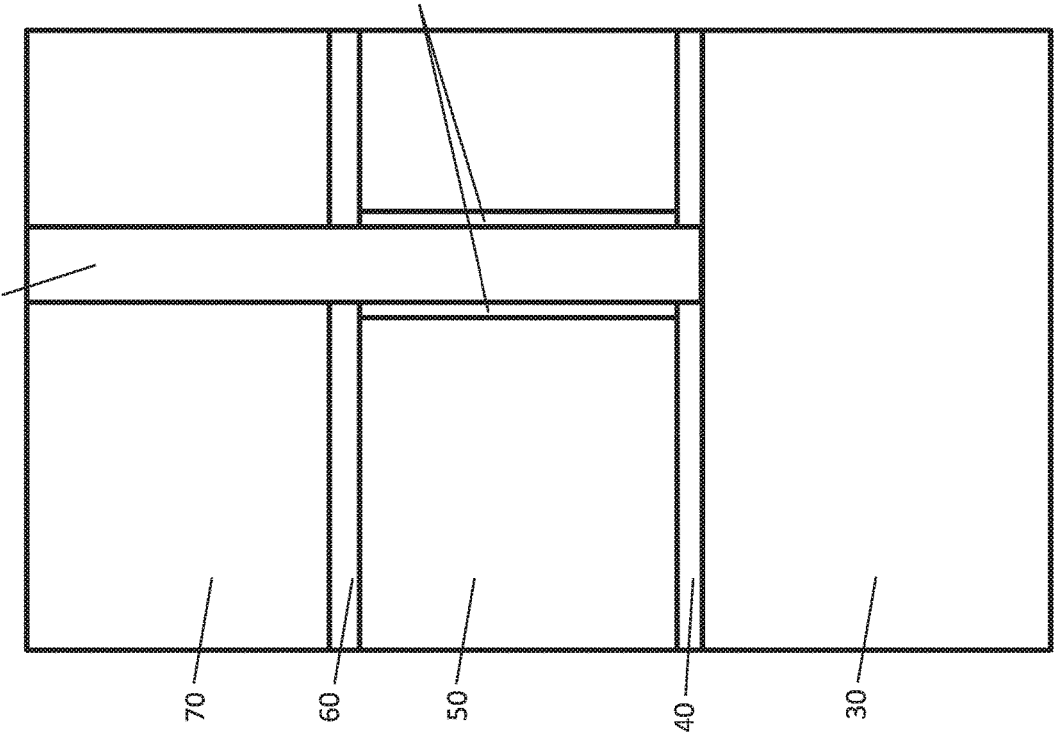

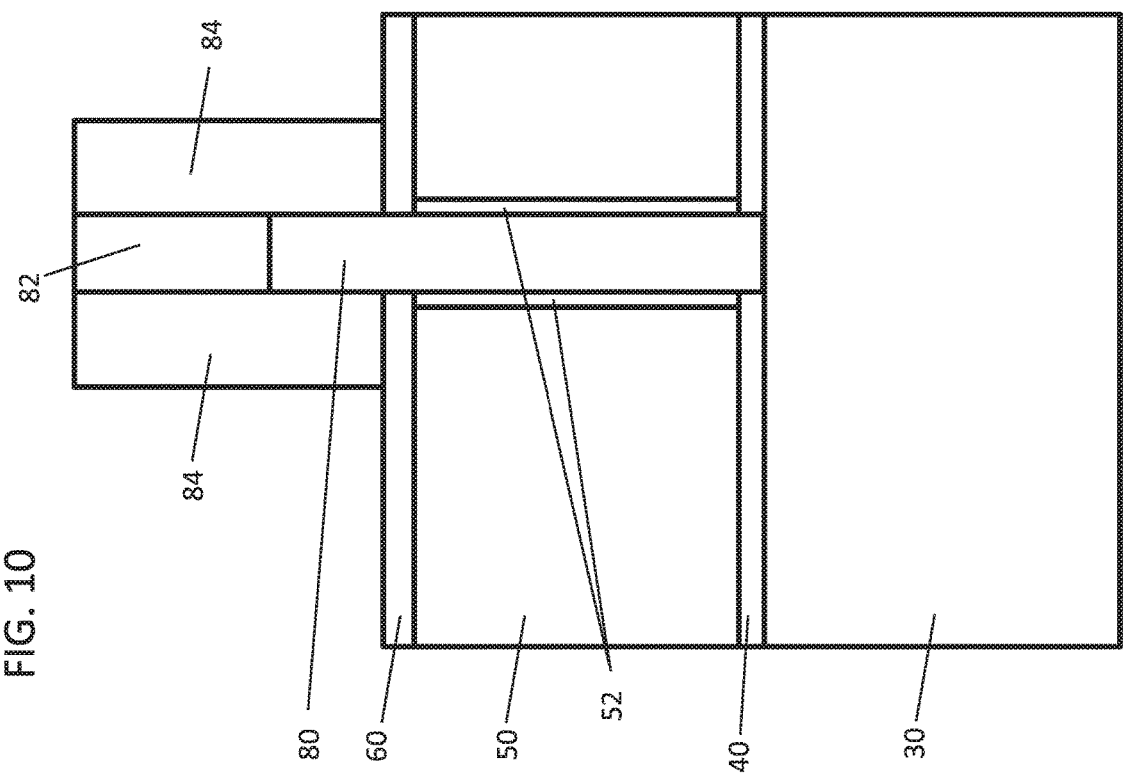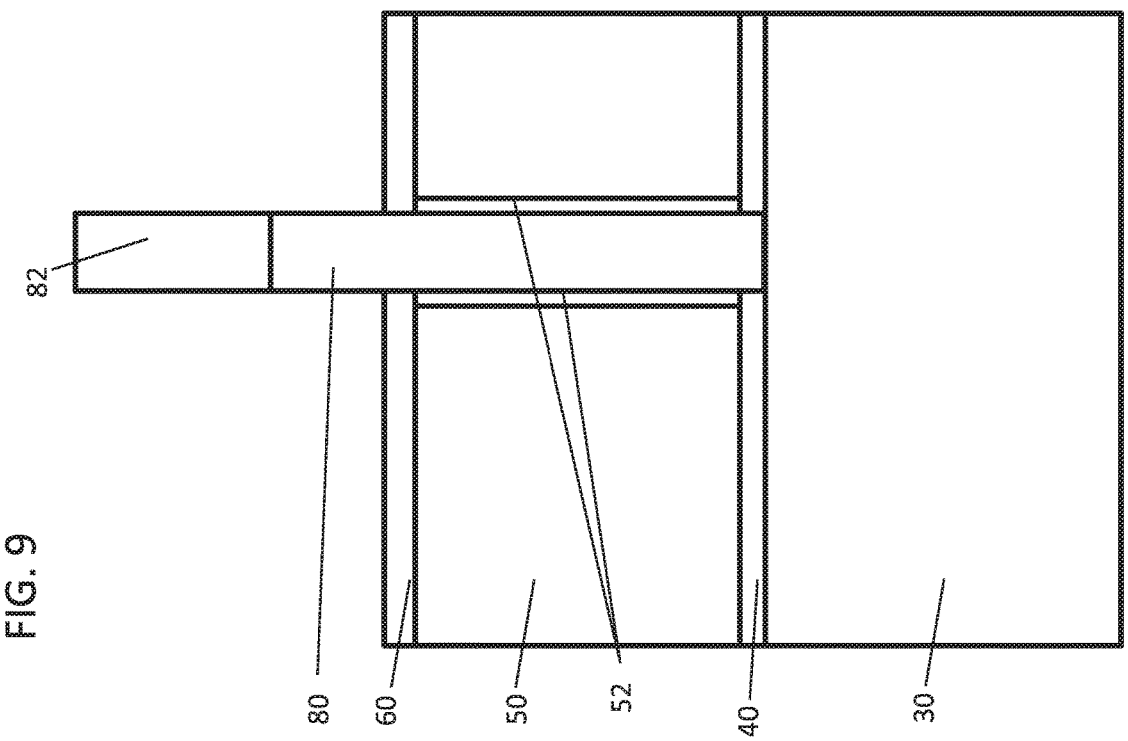

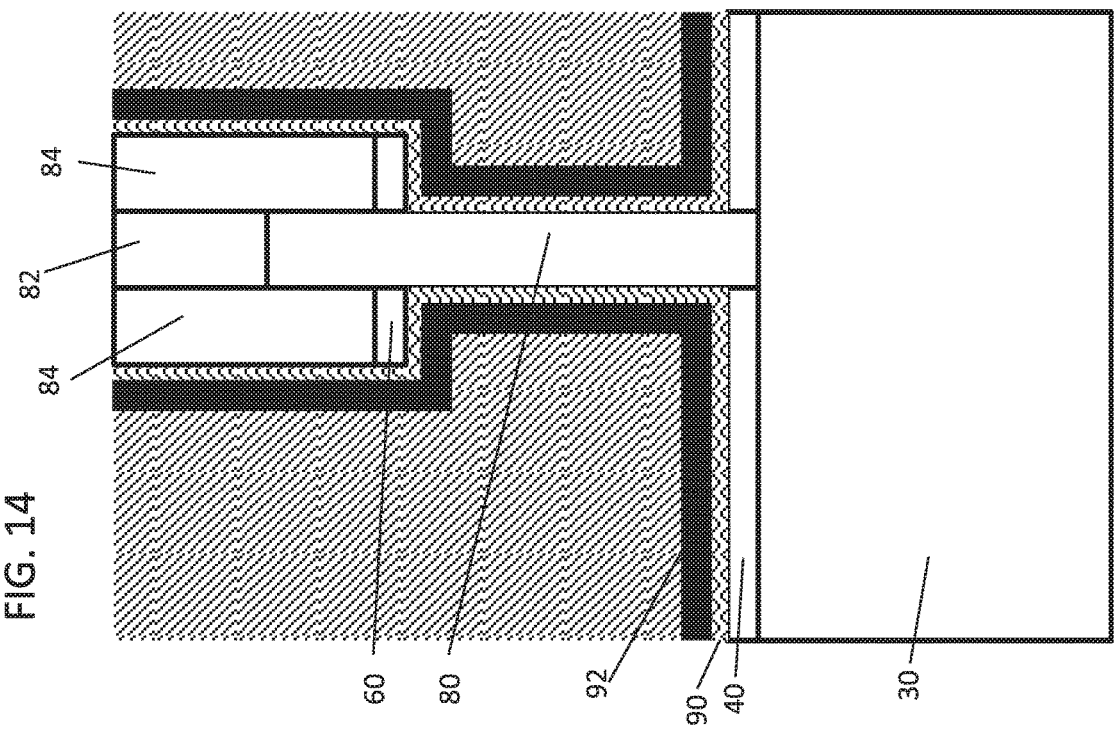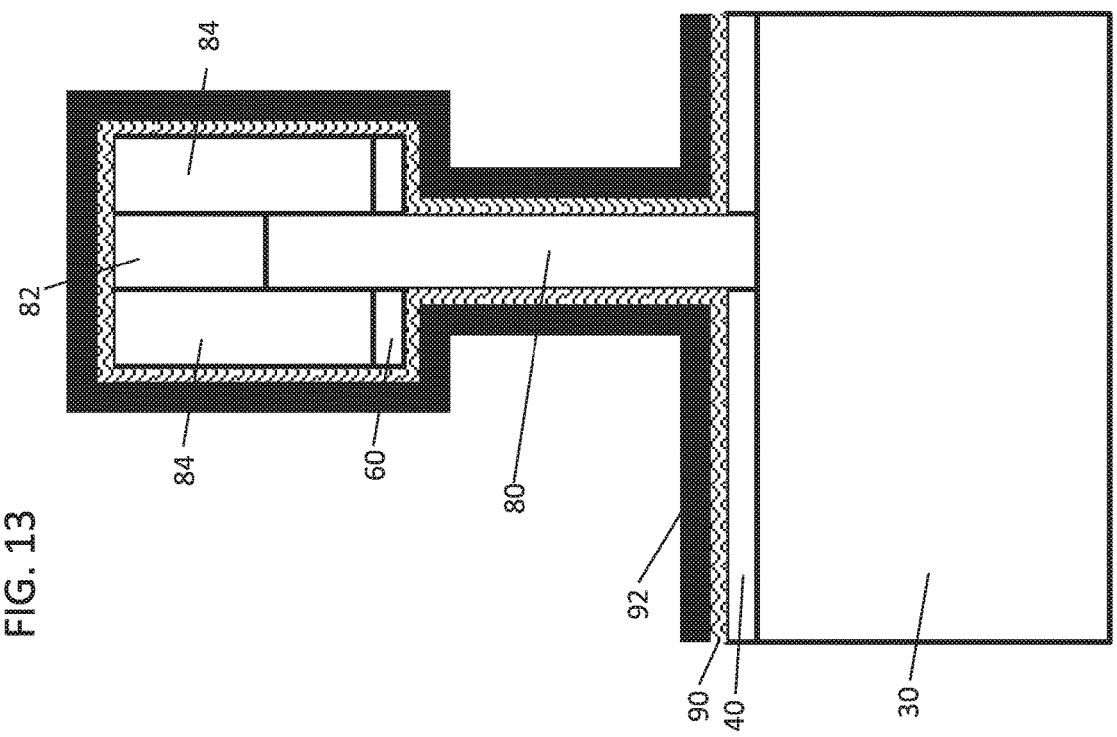

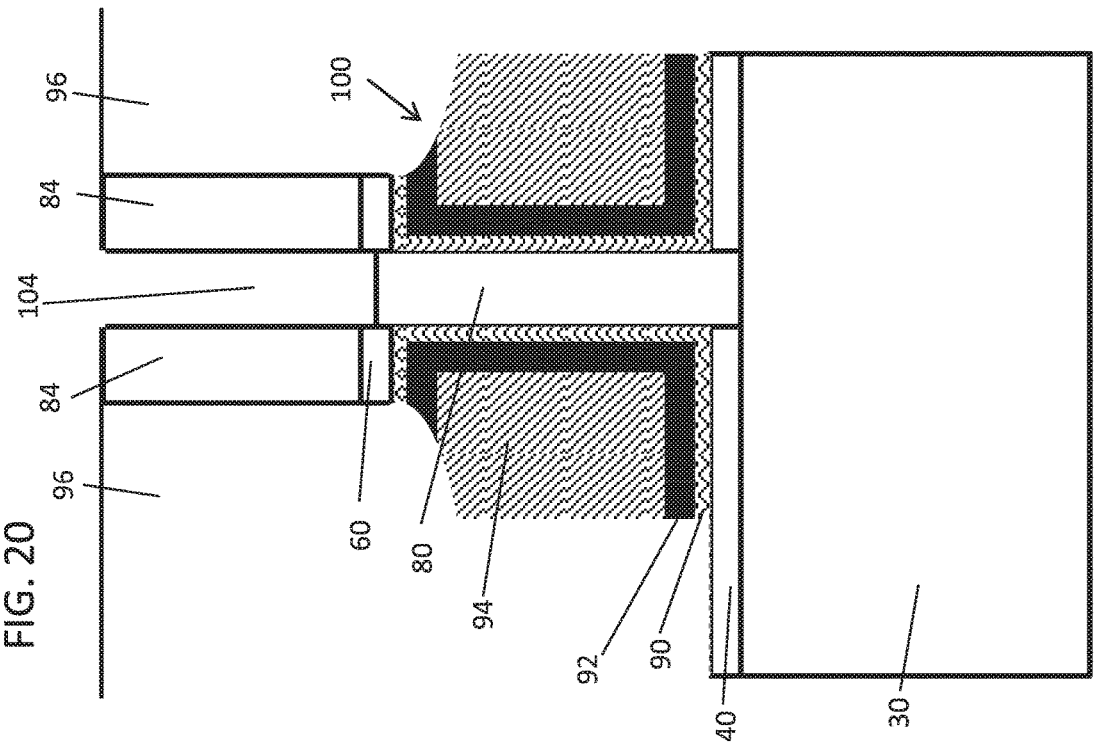
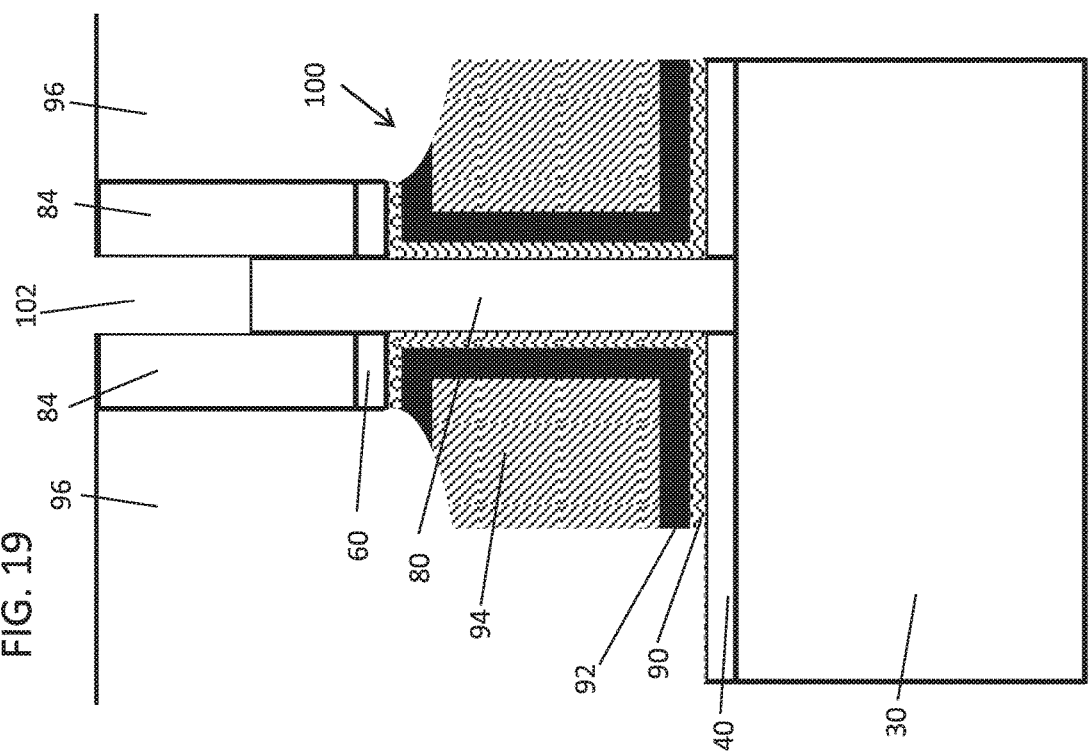

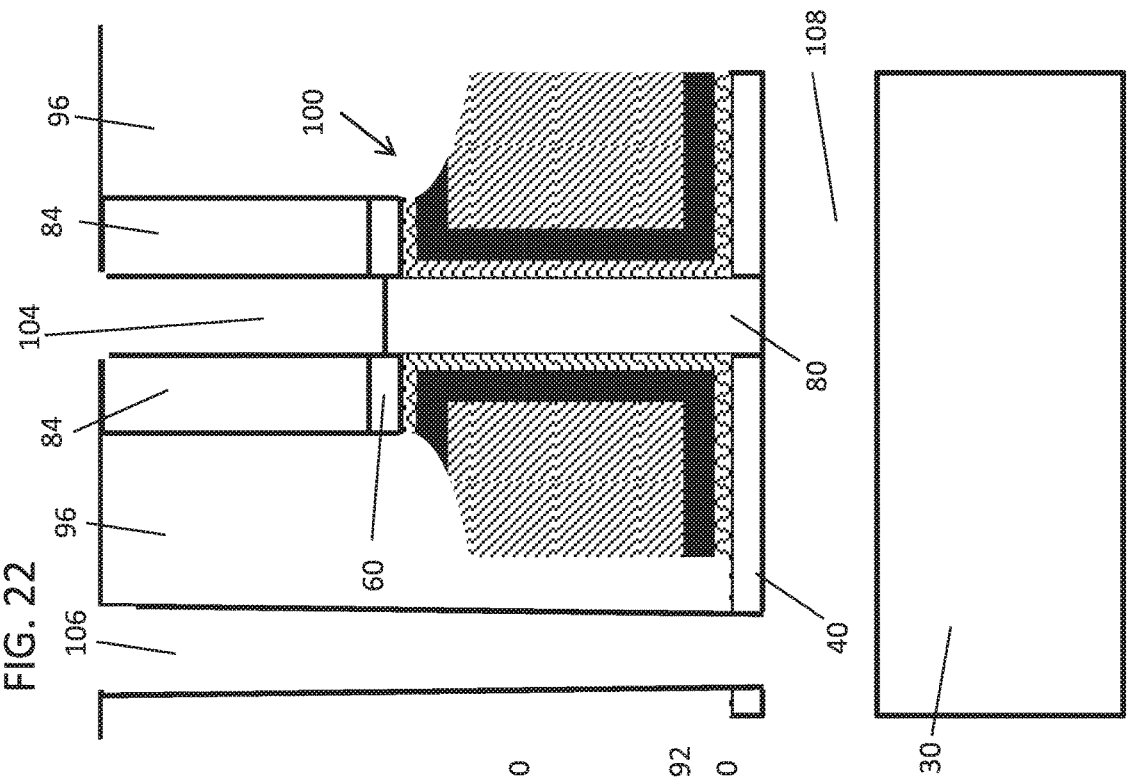
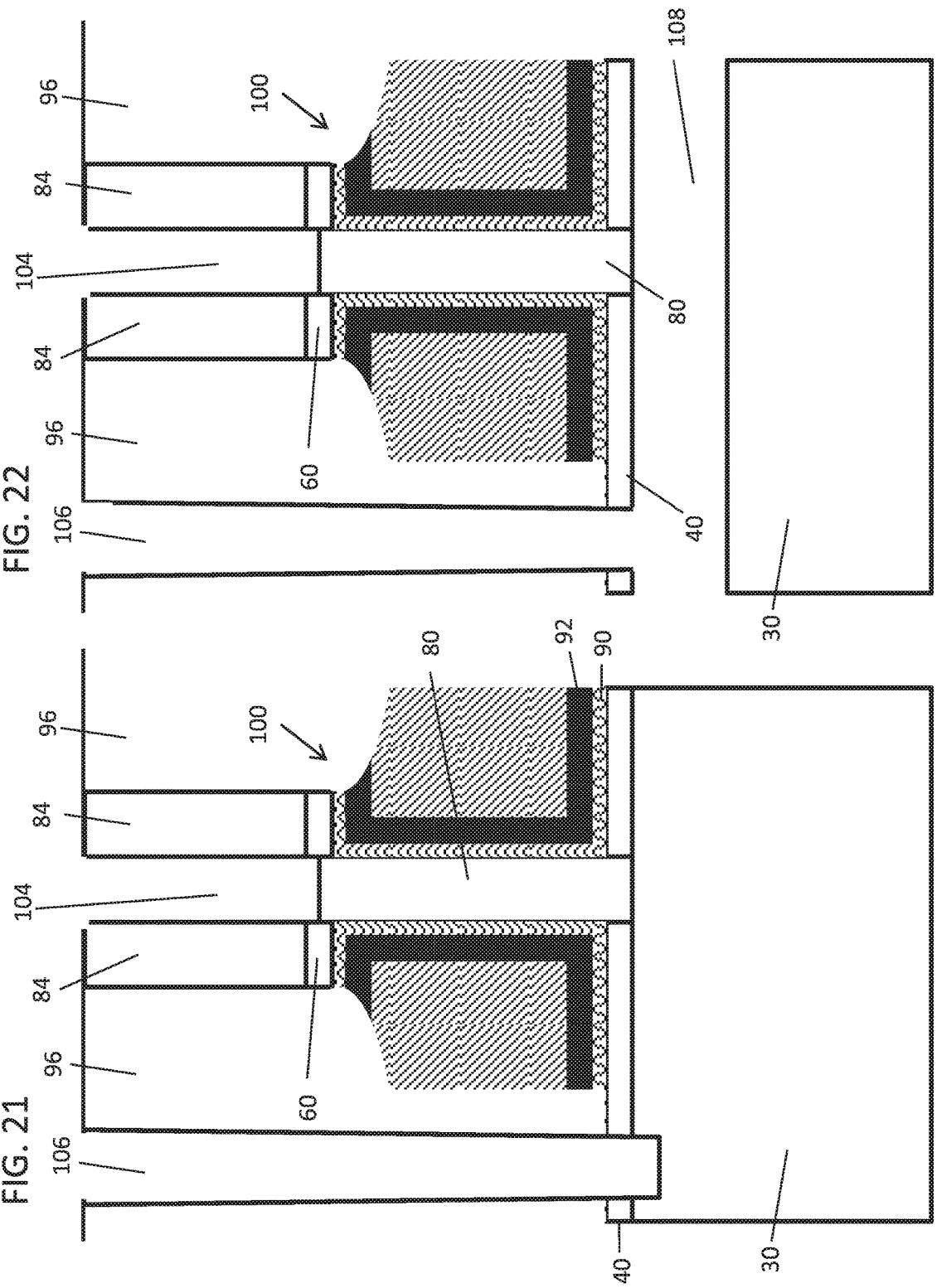

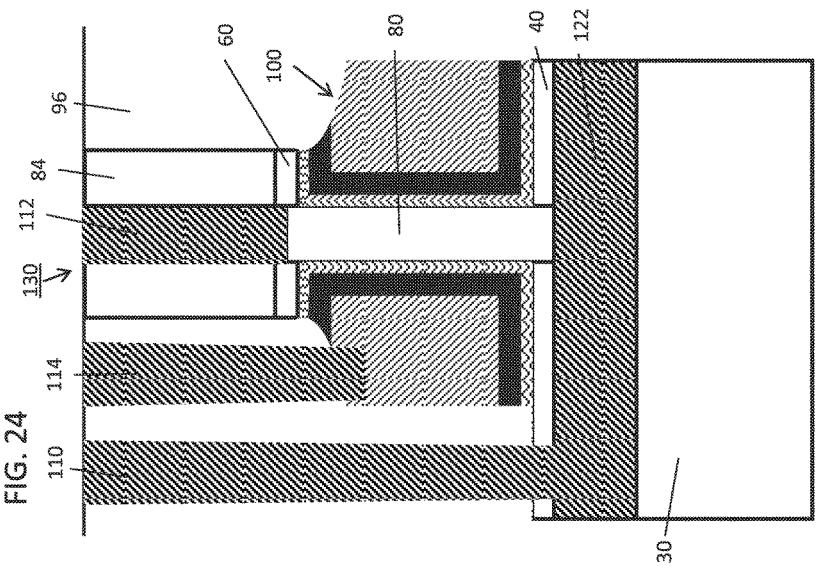
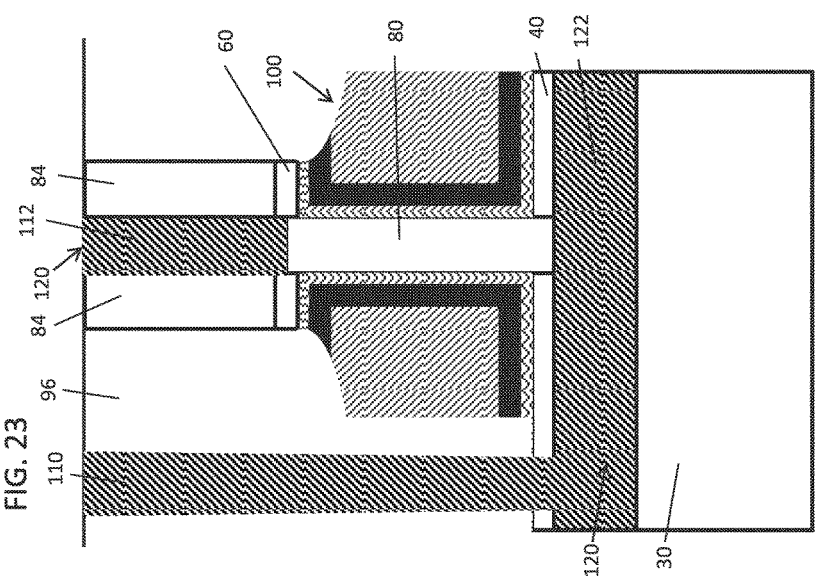

VERTICAL SCHOTTKY BARRIER FET

BACKGROUND

Technical Field

The present invention generally relates to semiconductor processing and devices, and more particularly, to vertical Schottky barrier field effect transistors (FETs).

Description of the Related Art

Vertical field effect transistors (VFETs) provide a viable complementary metal oxide semiconductor (CMOS) architecture for node sizes beyond a 7 nm node. In a VFET, current flows vertically. Access resistance (e.g., junction and contact resistance) of contacts from a bottom source/drain to a channel is a major problem for the performance gain expected in vertical transistor structures.

SUMMARY

A method for fabricating a vertical Schottky barrier transistor includes forming fin trenches through a dielectric layer and a dummy gate stack on a substrate to expose an underlying semiconductor material. The dummy gate stack includes a bottom spacer, a dummy gate layer and a top spacer layer. Fins are epitaxially grown in the fin trenches from the underlying semiconductor material. The dummy gate layer is removed and forms a gate structure about the fins including a gate dielectric and a gate conductor. An interlevel dielectric (ILD) layer is deposited. A top of the fins is exposed to form a channel contact opening. A contact trench is formed through the ILD layer and into the underlying semiconductor material. A cavity is formed in the underlying semiconductor material below the bottom spacer layer. The cavity, the contact trench and the channel contact opening are filled with a conductive fill.

Another method for fabricating a vertical Schottky barrier transistor includes forming fin trenches through a dielectric layer and a dummy gate stack on a substrate to expose an underlying semiconductor material, the dummy gate stack including a bottom spacer, a dummy gate layer and a top spacer layer, epitaxially growing fins in the fin trenches from the underlying semiconductor material, and recessing the fins into the fin trenches. A dielectric cap is formed in the fin trenches on the fins, and the dielectric layer is removed to expose the cap and a portion of the fin. Spacers are formed on the cap and the portion of the fin. The top spacer layer and the dummy gate layer are etched below the spacers. The dummy gate layer is removed. A gate dielectric and a metal are conformally deposited on exposed sidewalls of the fins. A gate conductor is formed, and an interlevel dielectric (ILD) layer is deposited. A top of the fins is exposed by removing the dielectric caps to form a channel contact opening. A contact trench is formed through the ILD layer and into the underlying semiconductor material. A cavity is formed in the underlying semiconductor material below the bottom spacer layer, and the cavity, the contact trench and the channel contact opening are filled with a conductive fill.

A vertical Schottky barrier transistor includes a bottom spacer layer formed over a Schottky barrier metal, and a vertically disposed channel passing through the bottom spacer layer and contacting the Schottky barrier metal on a first side of the channel. A top contact is connected to a second side of the channel, and a gate structure is formed about the channel.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 3 is a cross-sectional view showing a dummy stack and a dielectric layer formed on a substrate in accordance with the present principles;

FIG. 4 is a cross-sectional view of the device of FIG. 3 having a fin trench formed through the dummy stack and the dielectric layer in accordance with the present principles;

FIG. 7 is a cross-sectional view of the device of FIG. 6 having an epitaxially grown fin formed in the fin trench and planarized in accordance with the present principles;

FIG. 8 is a cross-sectional view of the device of FIG. 7 having the fin recessed into the fin trench and a dielectric cap formed in the recess in accordance with the present principles;

FIG. 9 is a cross-sectional view of the device of FIG. 8 having the dielectric layer removed in accordance with the present principles;

FIG. 10 is a cross-sectional view of the device of FIG. 9 having a spacer formed over the cap and a top portion of the fin in accordance with the present principles;

FIG. 13 is a cross-sectional view of the device of FIG. 12 having a gate dielectric and a work function metal conformally formed in accordance with the present principles;

FIG. 14 is a cross-sectional view of the device of FIG. 13 having a gate conductor formed and planarized in accordance with the present principles;

FIG. 19 is a cross-sectional view of the device of FIG. 18 having the dielectric cap removed in accordance with the present principles;

FIG. 20 is a cross-sectional view of the device of FIG. 19 having the fin recessed in accordance with the present principles;

FIG. 21 is a cross-sectional view of the device of FIG. 20 having a contact trench formed into a sacrificial underlying layer in accordance with the present principles;

FIG. 22 is a cross-sectional view of the device of FIG. 21 having a cavity formed through the contact trench by etching into the sacrificial underlying layer in accordance with the present principles;

FIG. 23 is a cross-sectional view of the device of FIG. 22 having a conductive fill formed in a trench over the channel, the contact trench and the cavity in accordance with the present principles;

FIG. 24 is a cross-sectional view of the device of FIG. 23 having a gate contact formed in accordance with the present principles.

DETAILED DESCRIPTION

Figure 2:
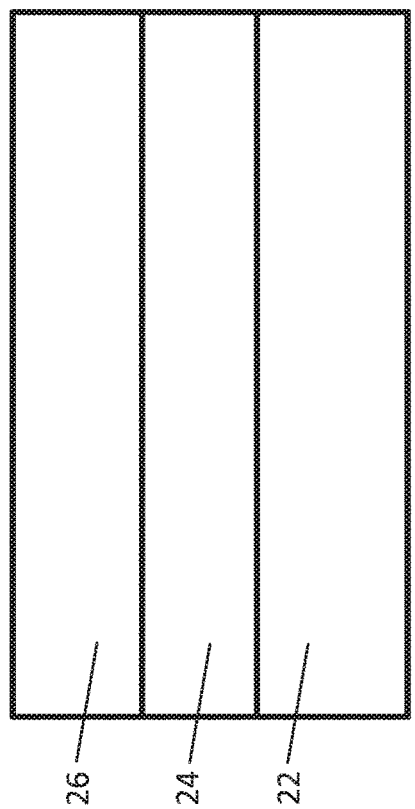
FIG. 2 is a cross-sectional view of a semiconductor-on-insulator substrate employed for making a vertical Schottky transistor in accordance with the present principles.

In accordance with the present principles, methods and structures for integrating vertical field effect transistors (FET) are provided. In useful embodiments, a vertical Schottky barrier transistor is provided to improve junction and contact resistance. In one embodiment, the vertical Schottky barrier transistor includes metal for many structures (except the channel). The vertical Schottky barrier transistor may be formed on any suitable substrate including, e.g., bulk or on-insulator structures.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms e intended to encompass different orientations of the device in use or operation in addition to the orientation depicted in the FIGs. For example, if the device in the FIGs. is to reed over, elements described as "below" "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

For purposes of this disclosure, vertical shall mean ill a directions perpendicular to a major surface of a semiconductor substrate and horizontal shall mean parallel with the major surface of the semiconductor substrate.

Figure 1:
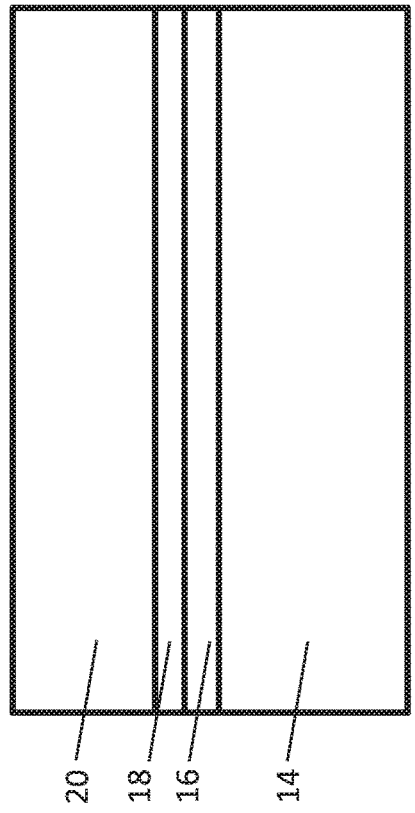
FIG. 1 is a cross-sectional view of a bulk substrate employed for making a vertical Schottky transistor in accordance with the present principles.

Referring now to the drawings in which like numerals represent the same or similar elements and initially to FIG. 1, an illustrative device 10 is shown for use in providing a vertical field effect transistor (VFET) with a Schottky barrier with a bulk substrate in accordance with the present principles. The device 10 includes a bulk substrate 14. The substrate 14 may include a bulk semiconductor material. The substrate 14 may include Si, SiGe, SiC, Ge, a III-V material (e.g., InP, InGaAs, GaAs, etc.) or any other suitable substrate material. In one particularly useful embodiment, the substrate 14 includes monocrystalline Si. The substrate 14 includes a well 16 formed in the substrate 14. The well 16 may be formed by an ion implantation process or other suitable doping process such as, e.g., solid phase doping. Thermal annealing can be performed after the doping process to activate dopants. In the embodiment shown, the well 16 may include a P-well for n-type FETs (NFETs) but may include an N-well in other embodiments for p-type FETs (PFETs), depending on the types of devices being fabricated. In one embodiment, the well 16 includes a counter doped layer (e.g., Si:P).

An etch stop layer 18 may be formed on the counter doped layer or well 16. The etch stop layer 18 is formed within material of the substrate 14, but having a different dopant type to change its etch selectivity. In one embodiment, the etch stop layer 18 may include Si:B. A sacrificial layer 20 may be epitaxially grown on the substrate 14. In one embodiment, the sacrificial layer 20 includes SiGe, although other materials may be employed.

Referring to FIG. 2, an illustrative device 12 is shown for use in providing a VFET with a Schottky barrier with a semiconductor-on-insulator (SeOI) substrate in accordance with the present principles. The device 12 includes a base substrate 22. The substrate 22 may include a semiconductor material. The substrate 22 may include Si, SiGe, SiC, Ge, a III-V material (e.g., InP, InGaAs, GaAs, etc.) or any other suitable substrate material. In one particularly useful embodiment, the substrate 22 includes monocrystalline Si.

The substrate 22 has a buried dielectric layer 24 formed thereon. The buried dielectric layer 24 may include an oxide, although other dielectric materials may be employed. A semiconductor layer 26 is provided on the buried dielectric layer 24. The semiconductor layer 26 may include SiGe and can be employed as a sacrificial layer (as layer 20) for SeOI embodiments.

It should be understood that other substrate structures and materials may be employed in accordance with the present principles. The substrate structures 10 and 12 will be referred to collectively as substrate structure 30 herein.

Referring to FIG. 3, a bottom spacer layer 40 may be formed on an exposed surface of the substrate structure 30. The bottom spacer layer 40 may be a dielectric material, for example, silicon oxide (SiO), silicon nitride (SiN), or boron nitride (BN). The bottom spacer layer 40 may be deposited by chemical vapor deposition (CVD), physical layer deposition (PVD), atomic layer deposition (ALD), as well as modifications thereof, such as plasma enhanced (e.g., PECVD), metal organic (e.g., MOCVD), electron beam (e.g., EB-PVD), low pressure (e.g., LPCVD), etc., or combinations thereof. The bottom spacer layer 40 may act as an etch stop layer during fabrication processes.

In one or more embodiments, the bottom spacer layer 40 may have a thickness in the range of about 2 nm to about 10 nm, or in the range of about 2 nm to about 5 nm. The thickness of the bottom spacer layer 40 may define the distance of a bottom edge of a gate structure from the substrate structure 30.

In one or more embodiments, a dummy gate layer 50 may be formed on the bottom spacer layer 40, which may provide a sacrificial template for forming a vertical gate structure on a channel. In various embodiments, the dummy gate layer 50 may be amorphous silicon (a-Si) or polycrystalline silicon (p-Si).

In one or more embodiments, the dummy gate layer 50 may have a thickness in the range of about 10 nm to about 100 nm, or in the range of about 10 nm to about 50 nm, or in the range of about 10 nm to about 20 nm.

In one or more embodiments, a top spacer layer 60 may be formed on the dummy gate layer 50, where the top spacer layer 60 may be the same material as the bottom spacer layer 40. The top spacer layer 60 may be a dielectric material, for example, silicon oxide (SiO), silicon nitride (SiN), silicon oxynitride (SiON), or boron nitride (BN). In one or more embodiments, the top spacer layer 60 may have a thickness in the range of about 2 nm to about 10 nm, or in the range of about 2 nm to about 5 nm. The top spacer layer 60 may have a different thickness than the bottom spacer layer 40. The top spacer layer 60 may be formed by one or more of the processes employed for the bottom spacer layer 40.

The bottom spacer layer 40, dummy gate layer 50 and top spacer layer 60 may form a channel layer stack, where the channel layer stack may provide a template for defining a vertical channel and/or forming a gate structure.

In one or more embodiments, a dielectric layer 70, e.g., an oxide layer, may be formed on the top spacer layer 60, where the layer 70 may be a sacrificial layer blanket deposited on the top spacer layer 60. The layer 70 may be silicon oxide (SiO), which may be formed by a CVD deposition or a PVD deposition. The oxide layer 70 may be a different material than the top spacer layer 60, such that the top spacer layer 60 may act as an etch stop layer.

Referring to FIG. 4, the dielectric layer 70, the dummy gate layer 50 and top spacer layer 60 may be etched in accordance with a lithographic pattern to open up trenches 72 down to the bottom spacer layer 40. The bottom spacer layer 40 acts as an etch stop and may include a different material to make the etch process selective with regards to the bottom spacer layer 40. The etch process may include a reactive ion etch (RIE).

Figure 5:
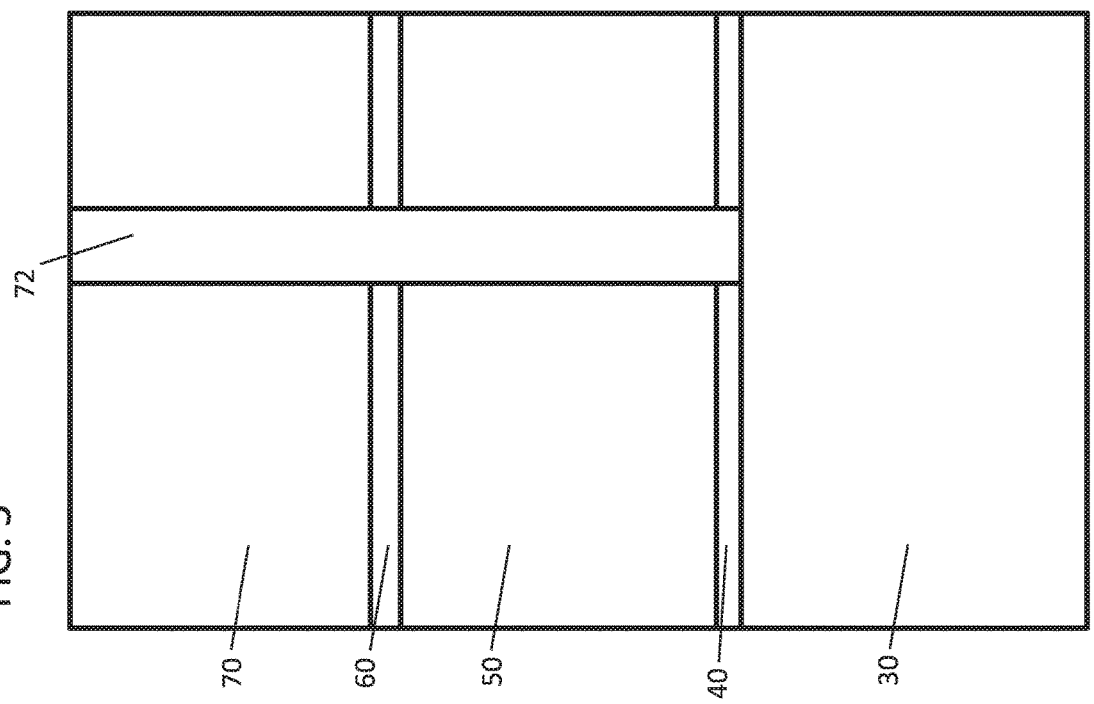
FIG. 5 is a cross-sectional view of the device of FIG. 4 having the fin trench formed through a bottom spacer layer in accordance with the present principles.

Referring to FIG. 5, the bottom spacer layer 40 is etched to expose the doped sacrificial layer 20 or doped semiconductor layer 26 of the substrate structure 30. The bottom spacer layer 40 is removed selectively to the semiconductor material of the substrate structure 30.

Figure 6:
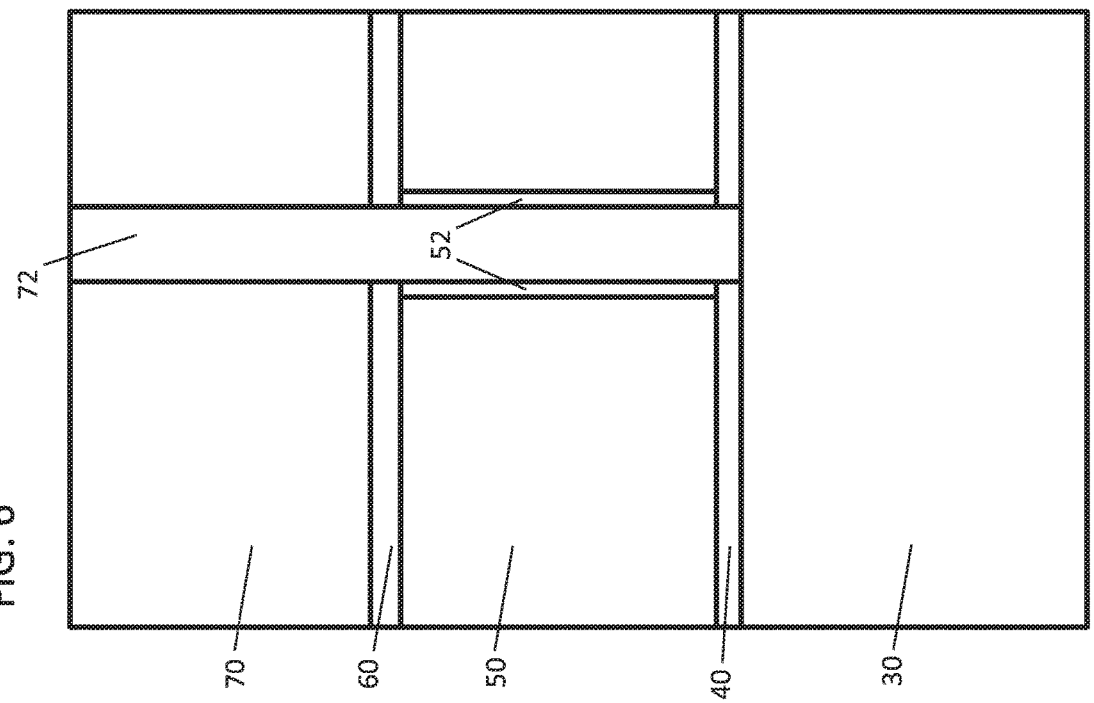
FIG. 6 is a cross-sectional view of the device of FIG. 5 having an thin oxide film formed on a dummy gate layer in accordance with the present principles.

Referring to FIG. 6, in one or more embodiments, after formation of the one or more trench(es) 72, at least a portion of the channel layer stack inside the one or more trenches 72 may be oxidized to form a dummy layer liner 52. In various embodiments, the dielectric layer 70, top spacer layer 60, dummy gate layer 50, and bottom spacer layer 40 may be exposed to oxidation, where the exposed portion of the dummy gate layer 50 inside the fin trench 72 may be oxidized to form the dummy layer liner 52. The dummy layer liner 52 may surround the trench 72 at the level of the dummy gate layer 50. The dummy layer liner 52 may protect the interface between a vertical fin to be formed and the dummy gate layer 50 during epitaxial growth and/or subsequent processes, where the dummy layer liner 52 may avoid an amorphous crystal structure of the dummy gate layer 50 interfering with the epitaxial growth.

In various embodiments, the dummy layer liner 52 may be formed by plasma oxidation or thermal oxidation of the sidewalls of the dummy gate layer 50 within the fin trenches 72. In various embodiments, thermal oxidation may be done using an oxidizing gas (e.g., $O_2$, $O_3$, etc.) at temperatures in the range of about 600° C. to about 1200° C. The oxidation of the dummy gate layer material (e.g., a-Si) may form $SiO_2$.

Referring to FIG. 7, vertical fins 80 may be formed within each of the fin trenches 72. The vertical fins 80 may be formed by epitaxial growth from the exposed surface of the substrate structure 30. In various embodiments, the substrate structure 30 may have a <100> or <111> crystal orientation, and the vertical fins 80 may be formed with the same crystal orientation as the substrate structure 30. The substrate structure 30 may have the same crystal orientation as the bulk substrate or an active layer on the substrate. In various embodiments, the top surface of the vertical fins 80 may have a <100> crystal orientation. By forming the vertical fin(s) 80 on the substrate structure 30, the source-channel junction is self-aligned at the common interface.

The vertical fins 80 are formed on the substrate structure 30, where regions of the substrate structure 30 may act as a source or a drain for a VFET, and the vertical fins 80 act as a channel for the VFET.

In one or more embodiments, the vertical fins 80 may be silicon, (Si), germanium (Ge), silicon-germanium (SiGe), gallium arsenide (GaAs), indium gallium arsenide (InGaAs), indium arsenide (InAs), or indium aluminum arsenide (InAlAs). The vertical fins 80 may be single-crystal epitaxially grown on the substrate structure 30. The vertical fins 80 may extend above the surface of the oxide layer 70 and expand laterally due to different growth rates of the different crystal faces. In particularly useful embodiments, Ge is included in the fins 80 to obtain electron and hole mobility benefits.

For the epitaxially grown materials 80, the epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), etc. can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material).

In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

When SiGe is epitaxially grown, the SiGe may have germanium content in the range of 5% to 80%, or preferably between 20% and 40%. Silicon and/or the SiGe may be doped with n-type dopants (e.g., phosphorus or arsenic) or p-type dopants (e.g., boron or gallium), depending on the type of transistor. In one or more embodiments, the one or more vertical fins 80 may have a width in the range of about 6 nm to about 20 nm, or may have a width in the range of about 8 nm to about 15 nm, or may have a width in the range of about 10 nm to about 12 nm, and a length in the range of about 30 nm to about 300 nm, or about 50 nm to about 150 nm.

A planarizing process is performed to remove access material from a top surface of the dielectric layer 70. The planarizing process may include chemical mechanical polishing (CMP).

Referring to FIG. 8, a fraction of the vertical fins 80 are recessed and removed from an upper portion of fin trench to form recess(es). In various embodiments, the height of the vertical fin 80 may be reduced, such that the top surface of the vertical fin 80 is below the top surface of the dielectric layer 70 but above the top surface of the top spacer layer 60. The fraction of a vertical fin 80 may be removed by a selective etch, where the selective etch may be a wet etch or a blanket RIE.

A dielectric fill 82 may be performed in the recesses formed in the trenches. The fill 82 may include nitride and more specifically silicon nitride. The fill 82 may extend above the top of the recesses and be planarized by a planarization process, e.g., CMP.

Referring to FIG. 9, the dielectric layer 70 above the top spacer layer 60 may be selectively removed to expose at least an upper portion 72 of the vertical fin 80 and dielectric fill 82. In various embodiments, the dielectric layer 70 may be removed by a wet etch and/or a blanket RIE.

Referring to FIG. 10, a dielectric material 84 is formed over the fill 82. The dielectric material 84, for example, silicon oxide (e.g., $SiO_2$) or silicon nitride (SiN) may be formed on the top spacer layer 60 and cover the fill or caps 82. The dielectric material 84 may be blanket deposited over the fill 82. In various embodiments, the height of the dielectric material 84 may be reduced by chemical-mechanical polishing (CMP) and/or etching.

In one or more embodiments, the dielectric material 84 may be patterned and portions removed to expose portions of the underlying top spacer layer 60. The dielectric material 84 may act as a hardmask for removing portions of the top spacer layer 60 and the dummy gate layer 50.

Figure 11:
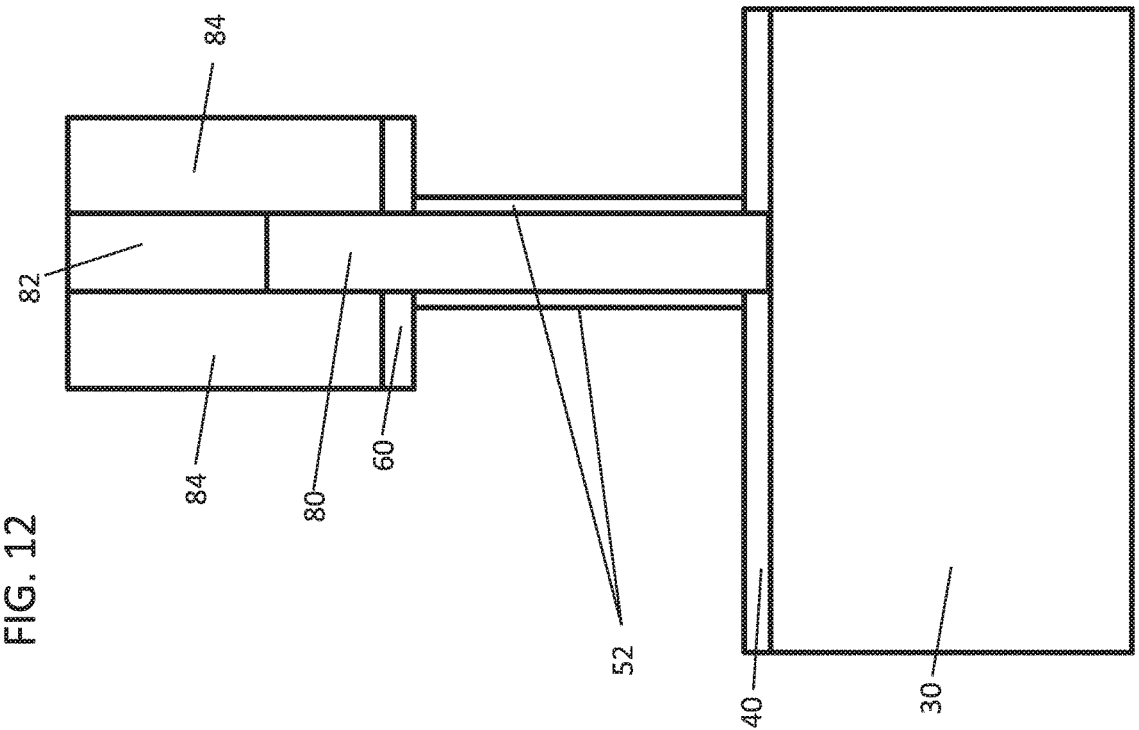
FIG. 11 is a cross-sectional view of the device of FIG. 10 using the spacer layer to etch a top spacer layer and the dummy gate layer in accordance with the present principles.

Referring to FIG. 11, a portion of the top spacer layer 60 and a portion of the dummy gate layer 50 may be removed. The top spacer layer 60 and the dummy gate layer 50 may be removed by a directional RIE.

Figure 12:
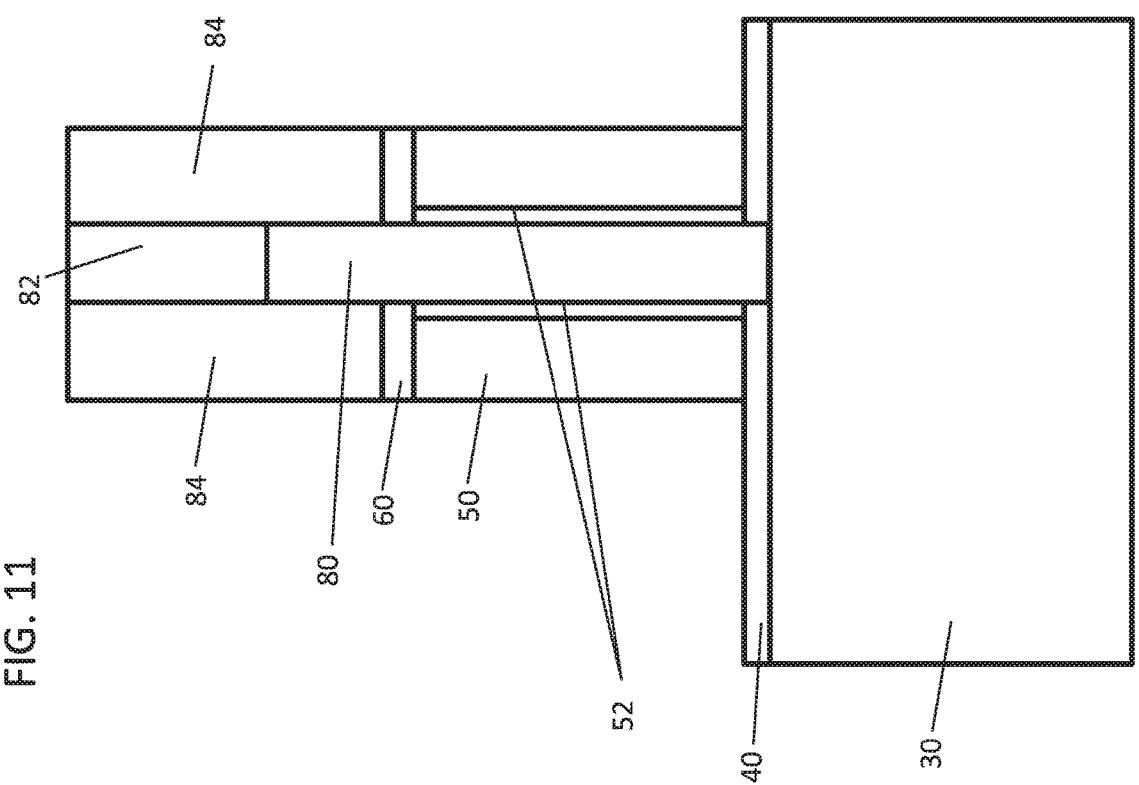
FIG. 12 is a cross-sectional view of the device of FIG. 11 after removing a remainder of the dummy gate layer in accordance with the present principles.

Referring to FIG. 12, the remaining portion of the dummy gate layer 50 shadowed by the patterned dielectric material 84 may be removed to expose the dummy layer liners 52 on the vertical fins 80. The remaining portion of the dummy gate layer 50 may be removed by a wet chemical etch.

Referring to FIG. 13, the dummy layer liners 90 on the vertical fins 80 may be removed by a wet etch or RIE, where the wet etch or RIE may selectively remove silicon oxide. After removing dummy layer liners 90, a gate dielectric layer 90 may be formed on the vertical fin 80, bottom spacer layer 40, and dielectric material 84, where the gate dielectric layer 90 may be conformally deposited. The gate dielectric layer 90 may be conformally deposited by atomic layer deposition (ALD) and/or CVD. The gate dielectric layer 90 may be a high-k material, including but not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric material may further include dopants such as lanthanum and/or aluminum. The stoichiometry of the high-k dielectric material may vary. In various embodiments, the gate dielectric layer 90 may have a thickness in the range of about 1.5 nm to about 2.5 nm.

In one or more embodiments, a work function layer 92 may be deposited over the gate dielectric layer 90, where the work function layer 92 may be conformally deposited by ALD and/or CVD. The work function layer 92 may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, including but not limited to titanium carbide (TiC), tantalum carbide (TaC), hafnium carbide (HfC), and combinations thereof. The work function layer 92 may have a thickness in the range of about 1 nm to about 11 nm, or may have a thickness in the range of about 2 nm to about 5 nm.

In one or more embodiments, the work function layer 92 may include a thin a gate metal layer (not shown) which may be formed on the work function layer 92, where the gate metal layer may include a thin layer conformally deposited on the work function layer 92. The gate metal layer may be conformally deposited by ALD or CVD, where the gate metal layer may have a thickness in the range of about 5 Å to about 15 Å. The gate metal layer may be tungsten (W), aluminum (Al), titanium nitride (TiN), cobalt (Co), or a combination thereof.

Referring to FIG. 14, a gate conductor 94 is deposited to fill spaces between structures. The gate conductor 94 may be tungsten (W), aluminum (Al), titanium nitride (TiN), cobalt (Co), or a combination thereof. The gate conductor 94 may be deposited using a CVD method. The gate conductor 94 material may be planarized, e.g., by CMP.

Figure 15:
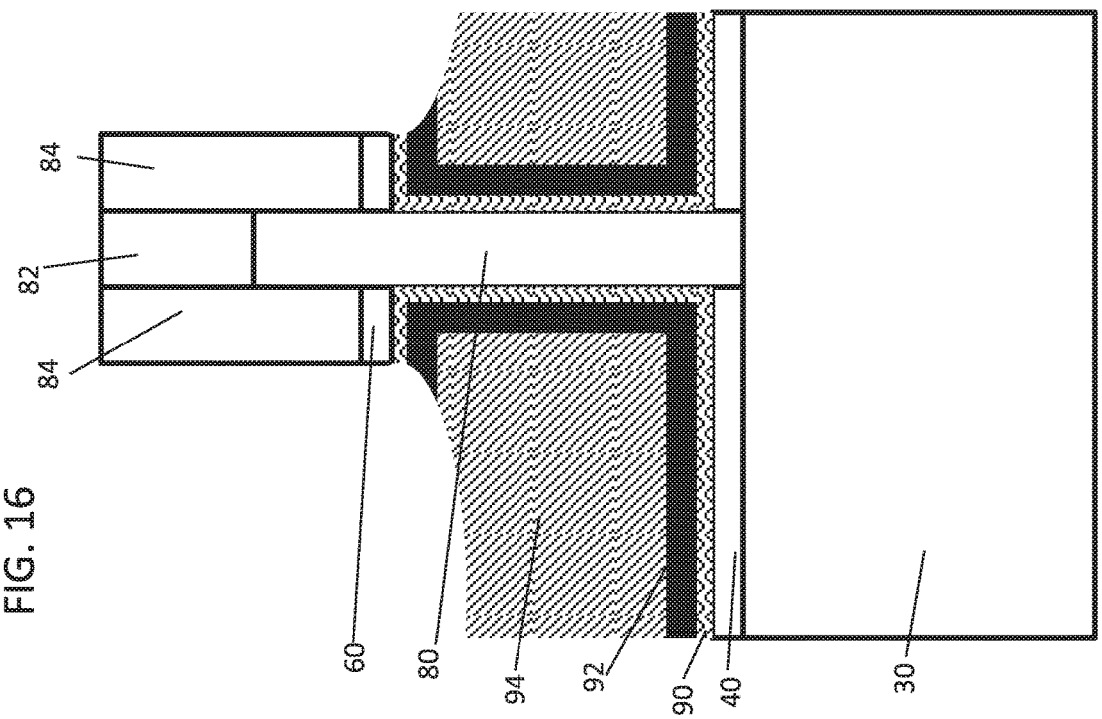
FIG. 15 is a cross-sectional view of the device of FIG. 14 having the gate conductor recessed in accordance with the present principles.

Referring to FIG. 15, a recess etch is performed to recess the gate conductor 94 to expose portions of the work function/gate metal layer 92. This may be performed be a wet or dry etch. Unneeded metal(s) for portions of gate conductor 94 may be etched away.

Figure 16:
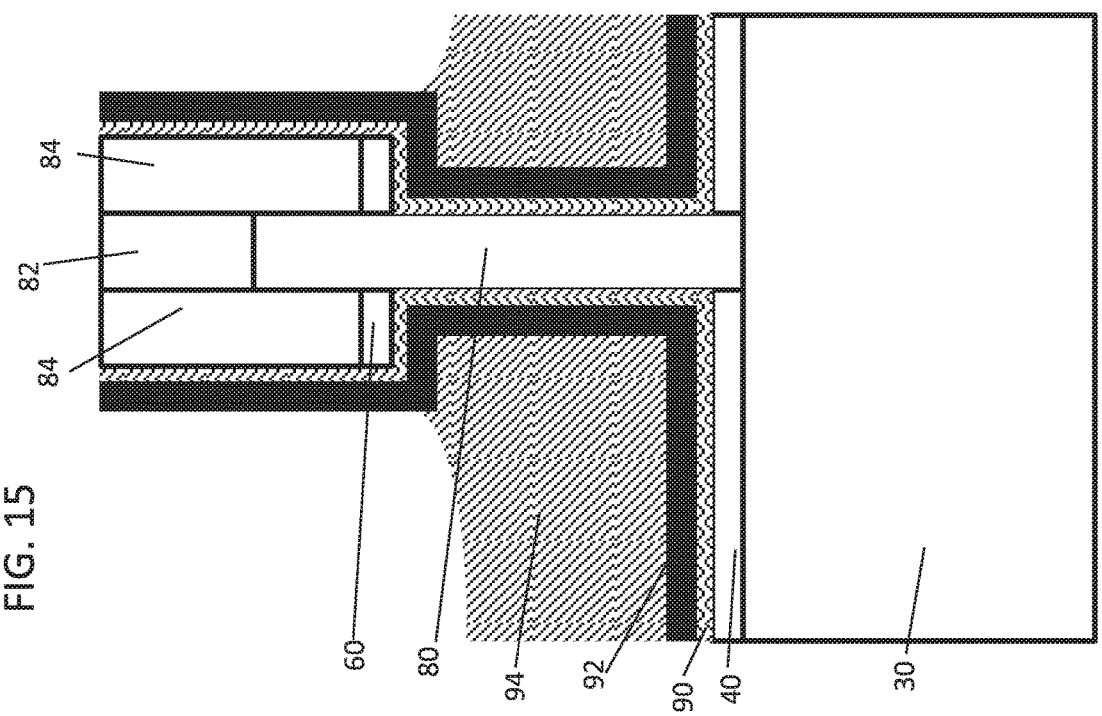
FIG. 16 is a cross-sectional view of the device of FIG. 15 having the work function metal and the gate dielectric recessed in accordance with the present principles.

Referring to FIG. 16, exposed portions of the work function layer/gate metal layer 92 and exposed portions of the high-k layer 90 may be removed to define a gate structure for each vertical fin 80. In various embodiments, the high-k layer 90, the gate conductor 94, and work function layer/gate metal layer 92 may form a gate structure at least on opposite sides of the vertical fin 80. In various embodiments, the gate structure may wrap around three sides or four sides of the vertical fin 80.

Figure 17:
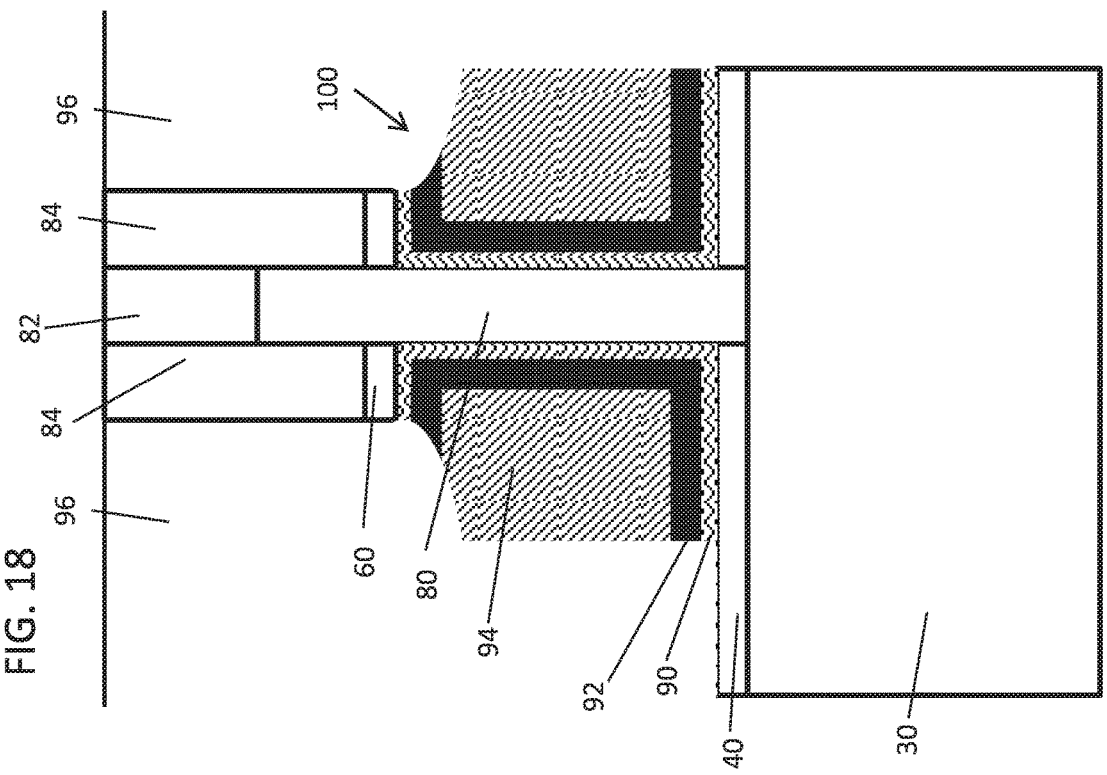
FIG. 17 is a cross-sectional view of the device of FIG. 16 having the gate conductor patterned in accordance with the present principles.

Referring to FIG. 17, the gate dielectric layer 90, work function layer 92, the gate metal layer and gate conductor 94 may be removed from at least a portion of the bottom spacer layer 40 to form a gate structure 100 on the vertical fins 80. In various embodiments, each layer may be removed by a suitable directional etching process (e.g., RIE) (e.g., patterning), where the underlying layer may act as an etch stop layer. In various embodiments, the gate conductor 94 may extend laterally beyond the dielectric material 90 to allow formation of a metal contact to the gate structure 100.

Figure 18:
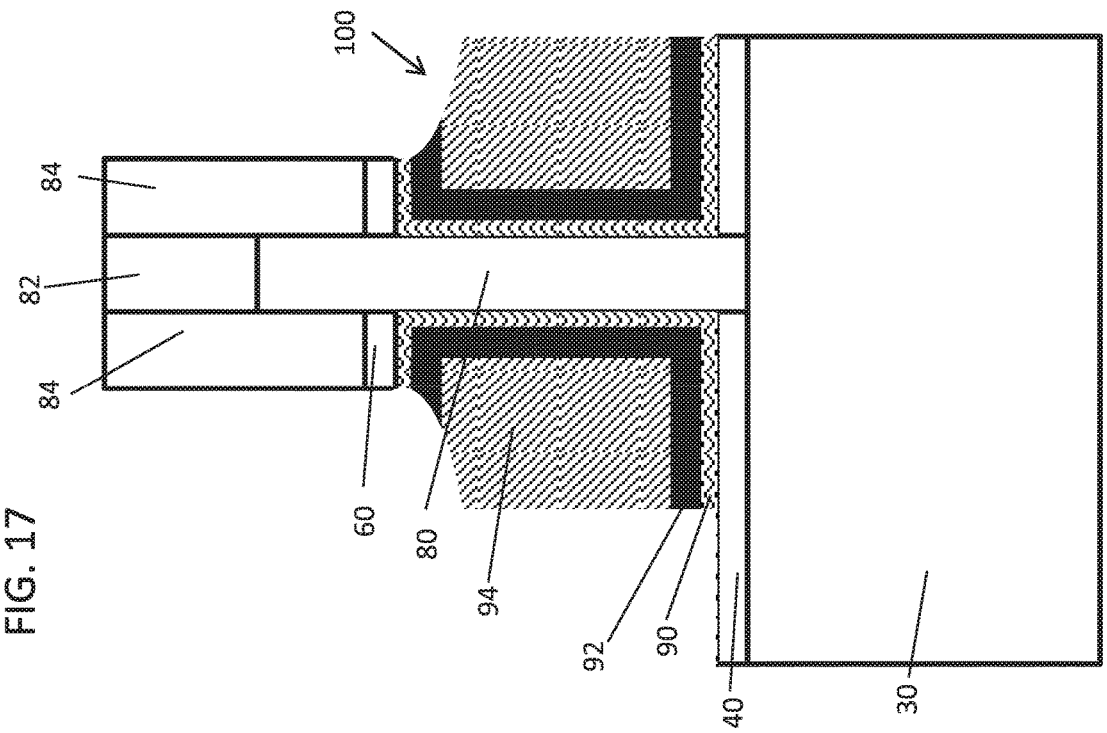
FIG. 18 is a cross-sectional view of the device of FIG. 17 having an interlevel dielectric (ILD) layer formed in accordance with the present principles.

Referring to FIG. 18, space above the gate conductor 94 may be filled with a dielectric fill 96 (e.g., an interlevel dielectric (ILD)) to fill in the space between neighboring structures, including vertical fins 80, and provide electrical insulation between devices and components. The dielectric fill 96 may include an oxide, although other suitable dielectric materials may be employed. In various embodiments, the height of the dielectric fill 96 may be reduced by CMP and/or etching.

Referring to FIG. 19, the cap 82 is removed by a selective etch process. The removal of the cap 82 forms a recess 102. The recess 102 exposes a portion of the fin 80.

Referring to FIG. 20, the exposed portion of the fin 80 in the recess 102 is etched to form recess 104. The fin 80 is recessed to below the spacers 84 to a position in between about the top spacer layer 60. The fin 80 forms a vertical device channel. The etch to form the recess 104 may include a wet etch, RIE or epitaxial gas etch.

Referring to FIG. 21, a trench or contact hole/opening 106 is patterned and etched into the ILD 96 and through bottom spacer layer 40 and into substrate structure 30. In particular, the hole/opening 106 stops on the sacrificial layer 20 or the semiconductor layer 26 (FIGS. 1 and 2, respectively). The etch is performed selective to the fin 80 and other materials.

Referring to FIG. 22, an etch process is performed that removes the sacrificial layer 20 or the semiconductor layer 26 (FIGS. 1 and 2, respectively) for the substrate structure 30 selective to the underlying materials and the fin 80. The underlying material includes the etch stop layer 18 in FIG. 1, if a bulk structure is employed for substrate structure 30. The underlying material includes the buried dielectric layer 24 in FIG. 2, if a SeOI structure is employed for substrate structure 30. The etch process creates a cavity 108 below the vertical channel (fin 80). In one embodiment, the sacrificial layer 20 or the semiconductor layer 26 (FIGS. 1 and 2, respectively) may include SiGe and may be removed by an acid etch (e.g., HCl etchant). The HCl etchant will not etch the fin 80 or the etch stop layer 18 (e.g., Si:B), or the buried dielectric layer 24 (e.g., silicon dioxide).

Referring to FIG. 23, a Schottky metal material 120 is deposited over the entire device and fills in the trench 106, cavity 108 and recess 104 (FIG. 19). The metal material 120 may include a metal (e.g., tungsten, titanium, tantalum, ruthenium, zirconium, cobalt, copper, aluminum, lead, platinum, tin, silver, gold) or a conducting metallic compound material (e.g., tantalum nitride, titanium nitride, tungsten silicide, tungsten nitride, ruthenium oxide, cobalt silicide, nickel silicide) or any suitable combination of these materials. The metal material 120 may be deposited by CVD, ALD or other suitable deposition processes. The metal material 120 is planarized to form a contact 110 and a contact 112. The contact 110 makes a connection to an electrode 122, which contacts a bottom side of the channel 80. The contact 112 makes a connection to a top side of the channel 80. The contact 112 and electrode 122 may function and source/drain regions for a vertical Schottky barrier FET in accordance with the present principles.

In various embodiments, the locations of the source and drain of the vertical transistor may be reversed such that the drain is on the top of a vertical fin, while the source is at the bottom. The source may, therefore, be at the bottom or the top.

Referring to FIG. 24, one or more trenches may be formed in the ILD 96 to form a contact hole/opening that lands on the gate conductor 94. The contact holes may extend vertically down through the gate conductor 94 to form metal contacts 114 for back end of line (BEOL) electrical connections to the gate structure(s). A vertical Schottky barrier transistor 130 is provided which includes improved junction and contact resistance since metal structures are employed for source/drain regions that contact the channel 80. In one embodiment, the vertical Schottky barrier transistor 130 includes metal for conducting structures (except the channel 80).

Figure 25:
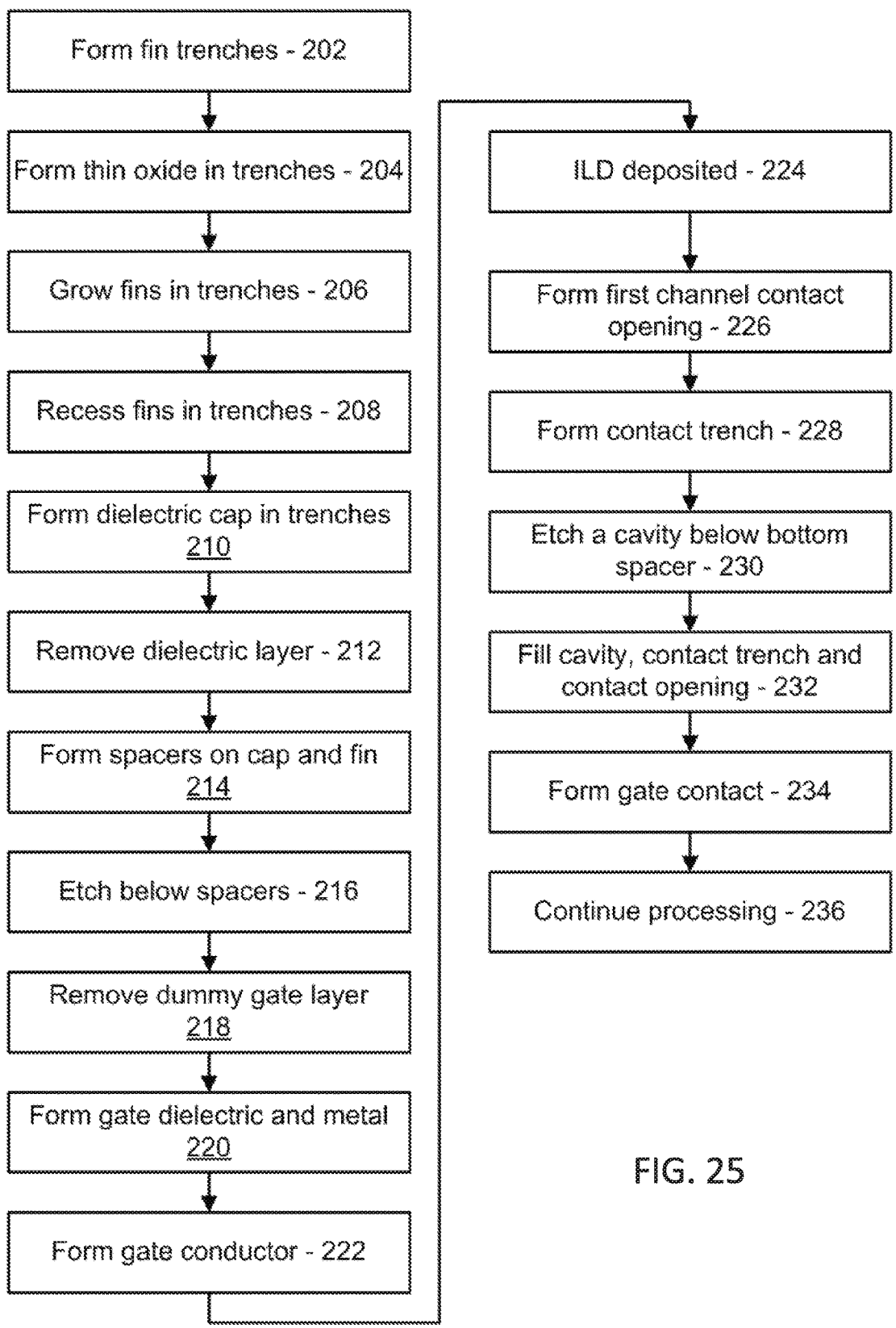
FIG. 25 is a block/flow diagram showing methods for forming a vertical Schottky barrier transistor in accordance with illustrative embodiments.

Referring to FIG. 25, methods for fabricating a vertical Schottky barrier transistor are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, fin trenches are formed through a dielectric layer and a dummy gate stack on a substrate to expose an underlying semiconductor material. The dummy gate stack may include a bottom spacer, a dummy gate layer and a top spacer layer. The substrate may include a bulk substrate having an etch stop layer or a semiconductor-on-insulator substrate. The underlying semiconductor material of the substrate may include a sacrificial semiconductor layer formed between materials of higher etch selectivity. The materials of higher etch selectivity may include the bottom spacer layer (e.g., SiN) and an etch stop layer (e.g., Si:B) formed in the substrate. In another embodiment, the underlying semiconductor material of the substrate may include a semiconductor layer formed on a buried dielectric layer of a semiconductor-on-insulator substrate.

In block 204, in one embodiment, the dummy gate layer includes amorphous silicon, and the amorphous silicon in the dummy gate layer is oxidized to form a thin oxide to subsequently permit removal of the dummy gate layer.

In block 206, fins are epitaxially grown in the fin trenches from the underlying semiconductor material. In block 208, the fins may be recessed into the fin trenches. In block 210, a dielectric cap may be formed in the fin trenches on the fins. In block 212, the dielectric layer is removed to expose the cap and a portion of the fin. In block 214, spacers are formed on the cap and the portion of the fin.

In block 216, the top spacer layer and the dummy gate layer are etched below the spacers. In block 218, the dummy gate layer is removed, and the thin oxide is removed from the channel (fin). In block 220, a gate dielectric and a metal (e.g., work function metal, etc.) are conformally deposited on exposed sidewalls of the fins and portions removed. In block 222, a gate conductor is formed (e.g., deposited and patterned). This completes the gate structure. In block 224, an ILD layer is deposited. In block 226, a top of the fins is exposed by removing the dielectric caps to form a channel contact hole or opening. The fins may be further recessed. In block 228, a contact trench is formed through the ILD layer and into the underlying semiconductor material.

In block 230, a cavity is formed in the underlying semiconductor material below the bottom spacer layer. An etchant, e.g., HCl, is passed through the contact trench to selectively remove a sacrificial material (e.g., SiGe). In block 232, the cavity, the contact trench and the channel contact hole are filled with a conductive fill. The conductive fill includes a metal, which forms a Schottky barrier with the channel formed by the fin. In this way, a vertical Schottky barrier transistor is provided with all metal components except for the channel. In block 234, a gate contact may be formed that lands on the gate conductor through the ILD layer. In block 236, processing continues to complete the device.

Having described preferred embodiments for a vertical Schottky barrier FET (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a vertical Schottky barrier transistor, comprising:
forming fin trenches through a dielectric layer and a dummy gate stack on a substrate to expose an underlying semiconductor material, the dummy gate stack including a bottom spacer, a dummy gate layer and a top spacer layer;
epitaxially growing fins in the fin trenches from the underlying semiconductor material;

removing the dummy gate layer and forming a gate structure about the fins including a gate dielectric and a gate conductor;

depositing an interlevel dielectric (ILD) layer;

exposing a top of the fins to form a channel contact opening;

forming a contact trench through the ILD layer and into the underlying semiconductor material;

forming a cavity in the underlying semiconductor material below the bottom spacer layer; and filling the cavity, the contact trench and the channel contact opening with a conductive fill.

2. The method as recited in claim 1, wherein the underlying semiconductor material of the substrate includes a sacrificial semiconductor layer formed between materials of higher etch selectivity.

3. The method as recited in claim 1, wherein the underlying semiconductor material of the substrate includes a semiconductor layer formed on a buried dielectric layer of a semiconductor-on-insulator substrate.

4. The method as recited in claim 1, wherein the dummy gate layer includes amorphous silicon, and the method further comprises: oxidizing the amorphous silicon in the dummy gate layer to form a thin oxide to permit removal of the dummy gate layer.

5. The method as recited in claim 1, wherein the conductive fill includes a metal which forms a Schottky barrier with a channel formed by the fin.

6. The method as recited in claim 1, further comprising forming a gate contact that lands on the gate conductor through the ILD layer.

7. The method as recited in claim 2, wherein the materials of higher etch selectivity include the bottom spacer layer and an etch stop layer formed in the substrate.

8. A method for fabricating a vertical Schottky barrier transistor, comprising:

forming fin trenches through a dielectric layer and a dummy gate stack on a substrate to expose an underlying semiconductor material, the dummy gate stack including a bottom spacer, a dummy gate layer and a top spacer layer;

epitaxially growing fins in the fin trenches from the underlying semiconductor material;

recessing the fins into the fin trenches;

forming a dielectric cap in the fin trenches on the fins;

removing the dielectric layer to expose the cap and a portion of the fin;

forming spacers on the cap and the portion of the fin;

etching the top spacer layer and the dummy gate layer below the spacers;

removing the dummy gate layer;

conformally depositing a gate dielectric and a metal on exposed sidewalls of the fins;

forming a gate conductor;

depositing an interlevel dielectric (ILD) layer;

exposing a top of the fins by removing the dielectric caps to form a channel contact opening;

forming a contact trench through the ILD layer and into the underlying semiconductor material;

forming a cavity in the underlying semiconductor material below the bottom spacer layer; and filling the cavity, the contact trench and the channel contact opening with a conductive fill.

9. The method as recited in claim 8, wherein the underlying semiconductor material of the substrate includes a sacrificial semiconductor layer formed between materials of higher etch selectivity.

10. The method as recited in claim 8, wherein the underlying semiconductor material of the substrate includes a semiconductor layer formed on a buried dielectric layer of a semiconductor-on-insulator substrate.

11. The method as recited in claim 8, wherein the dummy gate layer includes amorphous silicon, and the method further comprises: oxidizing the amorphous silicon in the dummy gate layer to form a thin oxide to permit removal of the dummy gate layer.

12. The method as recited in claim 8, wherein the conductive fill includes a metal which forms a Schottky barrier with a channel formed by the fin.

13. The method as recited in claim 8, further comprising forming a gate contact that lands on the gate conductor through the ILD layer.

14. The method as recited in claim 9, wherein the materials of higher etch selectivity include the bottom spacer layer and an etch stop layer formed in the substrate.

* * * * *